United States Patent
Cok (10) Patent No.: US 7,560,747 B2
(45) Date of Patent: Jul. 14, 2009

(54) LIGHT-EMITTING DEVICE HAVING IMPROVED LIGHT OUTPUT

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 13 days.

(21) Appl. No.: 11/742,745

(22) Filed: May 1, 2007

(65) Prior Publication Data

US 2008/0272367 A1 Nov. 6, 2008

(51) Int. Cl.
H01L 33/00 (2006.01)
(52) U.S. Cl. ............. 257/98; 257/E33.04; 257/E21.102
(58) Field of Classification Search ................ 257/98, 257/E33.044, E21.102
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,955,837 A | 9/1999 | Horikx et al. | |
| 6,226,890 B1 | 5/2001 | Boroson et al. | |
| 6,268,695 B1 | 7/2001 | Affinito | |
| 6,392,340 B2 | 5/2002 | Yoneda et al. | |
| 6,413,645 B1 | 7/2002 | Graff et al. | |
| 6,522,067 B1 | 2/2003 | Graff et al. | |
| 6,777,871 B2 | 8/2004 | Duggal et al. | |
| 6,787,796 B2 | 9/2004 | Do et al. | |
| 2001/0026124 A1 | 10/2001 | Liu et al. | |
| 2001/0033135 A1 * | 10/2001 | Duggal et al. | 313/506 |
| 2004/0061136 A1 | 4/2004 | Tyan et al. | |
| 2004/0217702 A1 | 11/2004 | Garner et al. | |
| 2005/0018431 A1 | 1/2005 | Shiang | |
| 2005/0194896 A1 | 9/2005 | Sugita et al. | |
| 2006/0186802 A1 | 8/2006 | Cok et al. | |
| 2006/0256263 A1 * | 11/2006 | Shimizu et al. | 349/113 |
| 2008/0087899 A1 * | 4/2008 | Sargent et al. | 257/80 |

(Continued)

FOREIGN PATENT DOCUMENTS

EP 1 603 367 11/2004

(Continued)

OTHER PUBLICATIONS

Tang et al., "Electroluminescence of doped organic thin films," Journal of Applied Physics, 65, pp. 3610-3616, 1989.

(Continued)

*Primary Examiner*—Cuong Q Nguyen
*Assistant Examiner*—Cathy N Lam
(74) *Attorney, Agent, or Firm*—Stephen H. Shaw; Raymond L. Owens (57) ABSTRACT

A light-emitting LED device has one or more light-emitting LED elements, including first and second spaced-apart electrodes with one or more light-emitting layers formed therebetween, wherein at least one of the electrodes is a transparent electrode. Also included are a first transparent encapsulating layer having a first optical index formed over the transparent electrode opposite the light-emitting layer; a light-scattering layer formed over the first transparent encapsulating layer opposite the transparent electrode; and a second transparent encapsulating layer, having a second optical index lower than the first optical index, formed over the light-scattering layer.

4 Claims, 5 Drawing Sheets

U.S. PATENT DOCUMENTS

2008/0170982 A1 * 7/2008 Zhang et al. .............. 423/447

FOREIGN PATENT DOCUMENTS

| JP | 2006172818 | 6/2006 |
|----|------------|--------|
| WO | 01/82390 | 11/2001 |
| WO | 02/37568 | 5/2002 |
| WO | 02/37580 | 5/2002 |
| WO | 03/090260 | 10/2003 |
| WO | 2004/105149 | 12/2004 |

OTHER PUBLICATIONS

Safonov et al., "Modivication of polymer light emission by lateral microstructure", Synthetic Metals, pp. 145-148, Elsevier Science B.V., 2001.

Lupton et al., "Bragg scattering from periodically microstructured light emitting diodes," Applied Physics Letter, vol. 77, No. 21, Nov. 20, 2000, pp. 3340-3342.

Tsutsui et al., "Sharply directed emission in organic electroluminescent diodes with an optical-microcavity structure," Applied Physics Letters 65, No. 15, 1994, pp. 1868-1870.

* cited by examiner

LIGHT-EMITTING DEVICE HAVING IMPROVED LIGHT OUTPUT

FIELD OF THE INVENTION

The present invention relates to light-emitting diode (LED) devices, and more particularly, to OLED device structures for improving light output and lifetime of OLED devices.

BACKGROUND OF THE INVENTION

Light-emitting diodes (LEDs) are a promising technology for flat-panel displays and area illumination lamps. The technology relies upon thin-film layers of organic materials coated upon a substrate. LED devices generally can have two formats known as small molecule devices such as disclosed in U.S. Pat. No. 4,476,292, issued Oct. 9, 1984 to Ham et al., and polymer OLED devices such as disclosed in U.S. Pat. No. 5,247,190, issued Sep. 21, 1993 to Friend et al. Either type of OLED device may include, in sequence, an anode, an organic EL element, and a cathode. The organic electroluminescent (EL) element disposed between the anode and the cathode commonly includes an organic hole-transporting layer (HTL), an emissive layer (EML) and an organic electron-transporting layer (ETL). Holes and electrons recombine and emit light in the EL layer. Tang et al. (Applied Physics Letter, 51, 913 (1987), Journal of Applied Physics, 65, 3610 (1989), and U.S. Pat. No. 4,769,292) demonstrated highly efficient OLEDs using such a layer structure. Since then, numerous LEDs with alternative layer structures, including organic or polymeric materials, or inorganic materials, have been disclosed and device performance has improved.

Light is generated in an LED device when electrons and holes that are injected from the cathode and anode, respectively, flow through the electron transport layer (ETL) and the hole transport layer (HTL) and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc.

LED devices can employ a variety of light-emitting organic materials patterned over a substrate that emit light of a variety of different frequencies, for example, red, green, and blue, to create a full-color display. However, patterned deposition is difficult, requiring, for example, expensive metal masks. Alternatively, it is known to employ a combination of emitters, or an unpatterned broad-band emitter to emit white light together with patterned color filters, for example, red, green, and blue, to create a full-color display. The color filters may be located on the substrate, for a bottom-emitter, or on the cover, for a top-emitter. For example, U.S. Pat. No. 6,392,340, issued May 21, 2002 to Yoneda et al., illustrates such a device. However, such designs are relatively inefficient, since approximately two thirds of the light emitted may be absorbed by the color filters.

It has been found that one of the key factors that limits the efficiency of LED devices is the inefficiency in extracting the photons generated by the electron-hole recombination out of the LED devices. Due to the relatively high optical indices of the organic and transparent electrode materials used, most of the photons generated by the recombination process are actually trapped in the devices due to total internal reflection. These trapped photons never leave the LED devices and make no contribution to the light output from these devices. Because light is emitted in all directions from the internal layers of the LED, some of the light emits directly from the device, and some is emitted into the device and is either reflected back out or is absorbed, and some of the light is emitted laterally and trapped and absorbed by the various layers comprising the device. In general, up to 80% of the light may be lost in this manner.

A typical LED device uses a glass substrate, a transparent conducting anode such as indium-tin-oxide (ITO), a stack of organic or inorganic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent cathode layer. Light generated from such an alternative device may be emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Figure 7:
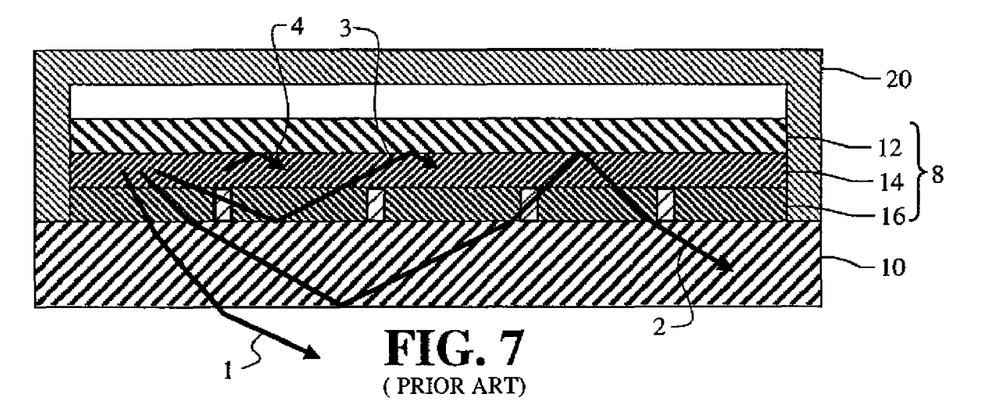
FIG. 7 illustrates the paths of various light rays within a cross section of a prior-art bottom-emitter OLED device.

In any of these LED structures, the problem of trapped light remains. Referring to FIG. 7, a bottom-emitting LED device as known in the prior art is illustrated having a substrate 10 (in this case transparent), a transparent first electrode 12, one or more layers of light-emitting material 14, a reflective second electrode 16, a gap 19 and a cover 20. First electrode 12, the one or more layers of light-emitting material 14 and reflective second electrode 16 form a light-emitting element 8. The gap 19 is typically filled with desiccating material. Light emitted from one of the material layers 14 can be emitted directly out of the device, through the transparent substrate 10, as illustrated with light ray 1. Light may also be emitted and internally guided in the transparent substrate 10 and material layers 14, as illustrated with light ray 2. Additionally, light may be emitted and internally guided in the layers of material 14, as illustrated with light ray 3. Light rays 4 emitted toward the reflective electrode 16 are reflected by the reflective first electrode 12 toward the substrate 10 and follow one of the light ray paths 1, 2, or 3. In some prior-art embodiments, the electrode 16 may be opaque and/or light absorbing. This LED display embodiment has been commercialized, for example, in the Eastman Kodak LS633 digital camera. The bottom-emitter embodiment shown may also be implemented in a top-emitter configuration with a transparent cover and top electrode.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the Emissive Layers; See "Modification Of Polymer Light Emission By Lateral Microstructure" by Safonov et al., Synthetic Metals 116, 2001, pp. 145-148, and "Bragg Scattering From Periodically Microstructured Light Emitting Diodes" by Lupton et al., Applied Physics Letters, Vol. 77, No. 21, Nov. 20, 2000, pp. 3340-3342. Brightness enhancement films having diffractive properties and surface and volume diffusers are described in WO2002/037568 entitled, "Brightness and Contrast Enhancement of Direct View Emissive Displays" by Chou et al., published May 10, 2002. The use of micro-cavity techniques is also known; for example, see "Sharply Directed Emission In Organic Electroluminescent Diodes With An Optical-Microcavity Structure" by Tsutsui et al., Applied Physics Letters 65, No. 15, Oct. 10, 1994, pp. 1868-1870. However, none of these approaches cause all, or nearly all, of the light produced to be emitted from the device.

Chou, in WO2002/037580 and Liu et al. in U.S. Patent Publication 2001/0026124, taught the use of a volume or surface scattering layer to improve light extraction. The scattering layer is applied next to the organic layers or on the outside surface of the glass substrate and has an optical index that matches these layers. Light emitted from the OLED device at higher than a critical angle that would have otherwise been trapped can penetrate into the scattering layer and be scattered out of the device. The efficiency of the OLED device is thereby improved, but still has deficiencies as explained below.

U.S. Pat. No. 6,787,796 entitled, "Organic Electroluminescent Display Device And Method Of Manufacturing The Same", issued Sep. 7, 2004 to Do et al., describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Publication 2004/0217702 entitled, "Light Extracting Designs For Organic Light Emitting Diodes", published Nov. 4, 2004 by Garner et al., similarly discloses use of microstructures to provide internal refractive index variations or internal or surface physical variations that function to perturb the propagation of internal waveguide modes within an LED. When employed in a top-emitter embodiment, the use of an index-matched polymer adjacent the encapsulating cover is disclosed.

Light-scattering layers used externally to an OLED device are described in U.S. Publication 2005/0018431 entitled, "Organic Electroluminescent Devices Having Improved Light Extraction", published Jan. 27, 2005, by Shiang and U.S. Pat. No. 5,955,837, issued Sep. 21, 1999, by Horikx, et al. These disclosures describe and define properties of scattering layers located on a substrate in detail. Likewise, U.S. Pat. No. 6,777,871, issued Aug. 17, 2004, by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

However, scattering techniques, by themselves, may cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, a pixellated bottom-emitting LED device may include a plurality of independently controlled sub-pixels (as shown in FIG. 7) and a scattering layer (not shown in FIG. 7) located between the transparent first electrode 12 and the substrate 10. A light ray 2, 3, or 4 emitted from the light-emitting layer may be scattered multiple times by a scattering layer (not shown in FIG. 7), while traveling through the substrate 10, organic layer(s) 14, and transparent first electrode 12 before it is emitted from the device. When the light ray 2, 3, or 4 is finally emitted from the device, the light ray 2, 3, or 4 may have traveled a considerable distance through the various device layers from the original sub-pixel location where it originated to a remote sub-pixel where it is emitted, thus reducing sharpness. Most of the lateral travel occurs in the substrate 10, because that is by far the thickest layer in the package. Also, the amount of light emitted is reduced due to absorption of light in the various layers.

U.S. Patent Publication 2004/0061136 entitled, "Organic Light Emitting Device Having Enhanced Light Extraction Efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

Co-pending, commonly assigned US Publication 2006/0186802, published 24 Aug. 2006, by Cok et al., describes the use of a transparent low-index layer having a refractive index lower than the refractive index of the encapsulating cover or substrate through which light is emitted and lower than the organic layers to enhance the sharpness of an OLED device having a scattering element. US Publication 2005/0194896, published Sep. 8, 2005 by Sugita et al., describes a nano-structure layer for extracting radiated light from a light-emitting device together with a gap having a refractive index lower than an average refractive index of the emissive layer and nano-structure layer. Such disclosed designs, however, are difficult to manufacture, and may still not extract all of the available light in the presence of conventional encapsulation layers that may be employed to protect the OLED from environmental damage.

It is also well known that OLED materials are subject to degradation in the presence of environmental contaminants, in particular moisture. Organic light-emitting diode (OLED) display devices typically require humidity levels below about 1000 parts per million (ppm) to prevent premature degradation of device performance within a specified operating and/or storage life of the device. Control of humidity levels within a packaged device is typically achieved by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the aforementioned level. See, for example, U.S. Pat. No. 6,226,890, issued May 8, 2001 to Boroson et al. describing desiccant materials for moisture-sensitive electronic devices. Such desiccating materials are typically located around the periphery of an OLED device or over the OLED device itself.

Figure 8:
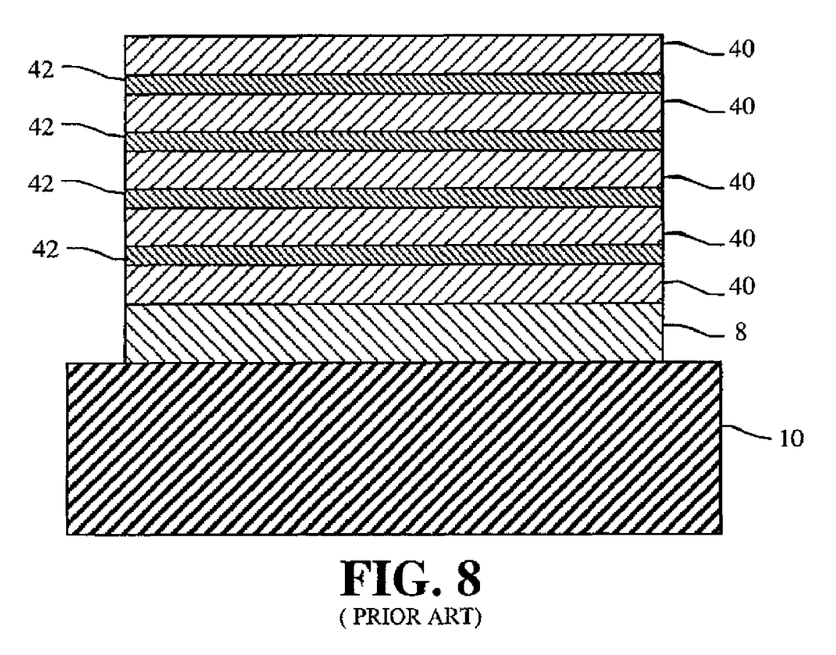
FIG. 8 illustrates a prior-art multi-layer encapsulation.

In alternative approaches, an OLED device is encapsulated using thin multi-layer coatings of moisture-resistant material. For example, layers of inorganic materials such as metals or metal oxides separated by layers of an organic polymer may be used as shown in prior-art FIG. 8. Referring to FIG. 8, a light-emitting element 8 is formed on a substrate 10. Alternating layers of organic material 40 and inorganic material 42 are formed over the light-emitting element 8 to protect the light-emitting element 8 from environmental contamination. Such coatings have been described in, for example, U.S. Pat. No. 6,268,695, issued Jul. 31, 2001 to Affinito, U.S. Pat. No. 6,413,645 issued Jul. 2, 2002 to Graff et al, and U.S. Pat. No. 6,522,067 issued Feb. 18, 2003 to Graff et al. A deposition apparatus is further described in WO2003/090260, entitled, "Apparatus for Depositing a Multilayer Coating on Discrete Sheets", published Oct. 20, 2003, by Pagano et al. WO2001/082390 entitled "Thin-Film Encapsulation of Organic Light-Emitting Diode Devices", published Nov. 1, 2001 by Ghosh et al., describes the use of first and second thin-film encapsulation layers made of different materials wherein one of the thin-film layers is deposited at 50 nm using atomic layer deposition (ALD) discussed below. According to this disclosure, a separate protective layer is also employed, e.g. parylene and/or $SiO_2$. Such thin multi-layer coatings typically attempt to provide a moisture permeation rate of less than $5\times10^{-6}$ $gm/m^2/day$ to adequately protect the OLED materials. In contrast, typically polymeric materials have a moisture permeation rate of approximately 0.1 $gm/m^2/day$ and cannot adequately protect the OLED materials without additional moisture blocking layers. With the addition of inorganic moisture blocking layers, 0.01 $gm/m^2/day$ may be achieved and it has been reported that the use of relatively thick polymer smoothing layers with inorganic layers may provide the needed protection. Thick inorganic layers, for example, 5 microns or more of ITO or ZnSe, applied by conventional deposition techniques such as sputtering or vacuum evaporation may also provide adequate protection, but thinner conventionally coated layers may only provide protection of 0.01 $gm/m^2/day$. WO2004/105149 entitled, "Barrier Films for Plastic Substrates Fabricated by Atomic Layer Deposition" published Dec. 2, 2004 by Carcia et al., describes gas permeation barriers that can be deposited on plastic or glass substrates by atomic layer deposition (ALD). Atomic Layer Deposition is also known as Atomic Layer Epitaxy (ALE) or atomic layer CVD (ALCVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also result in light trapped in the protective layers since they may be of lower index than the light-emitting organic layers.

There is a need therefore for an improved organic light-emitting diode device structure that avoids the problems noted above and improves the lifetime, efficiency, and sharpness of the LED device.

SUMMARY OF THE INVENTION

The aforementioned need is met by the present invention. In one embodiment of the present invention a light-emitting LED device includes one or more light-emitting LED elements including first and second spaced-apart electrodes with one or more light-emitting layers formed there-between, wherein at least one of the electrodes is a transparent electrode. Also included in the embodiment are a first transparent encapsulating layer having a first optical index formed over the transparent electrode opposite the light-emitting layer; a light-scattering layer formed over the first transparent encapsulating layer opposite the transparent electrode; and a second transparent encapsulating layer, having a second optical index lower than the first optical index, formed over the light-scattering layer.

Another aspect of the present invention provides a method of forming a light-emitting LED device that includes the steps of:

a) providing a substrate;
b) forming one or more light-emitting LED elements including first and second spaced-apart electrodes with one or more light-emitting layers there-between, wherein at least one of the electrodes is a transparent electrode over the substrate;
c) forming a first transparent encapsulating layer having a first optical index over the transparent electrode opposite the light-emitting layer;
d) forming a light-scattering layer over the first transparent encapsulating layer opposite the transparent electrode; and
e) forming a second transparent encapsulating layer, having a second optical index lower than the first optical index, over the light-scattering layer.

ADVANTAGES

The present invention has the advantage that it increases the light output from, improves the sharpness of, and the environmental protection for an LED device.

It will be understood that the figures are not to scale, since the individual layers are too thin and the thickness differences of various layers too great to permit scaled illustrative depiction.

DETAILED DESCRIPTION OF THE INVENTION

Figure 1:
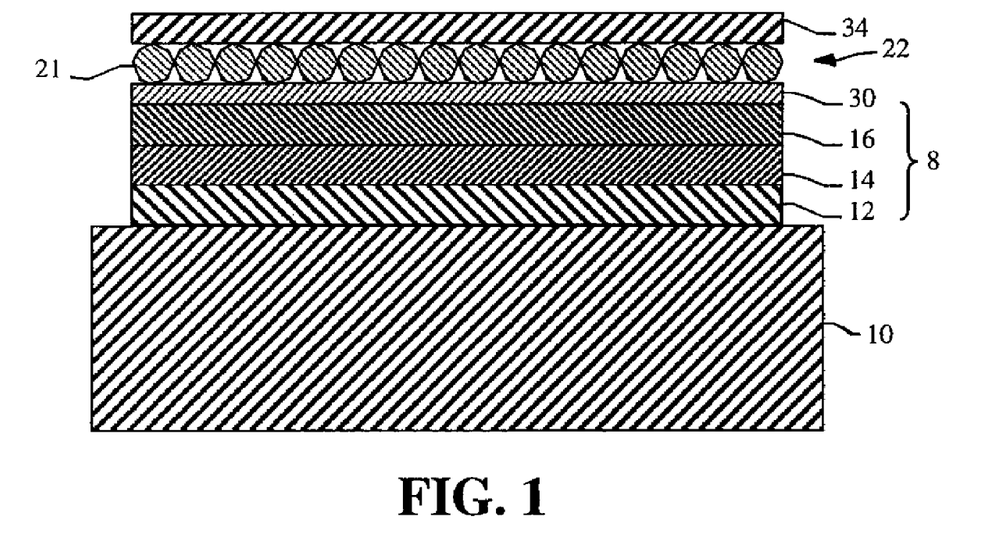
FIG. 1 is a cross section of an LED device having encapsulation layers and a light-scattering layer according to one embodiment of the present invention.

Referring to FIG. 1, in accordance with one embodiment of the present invention, a light-emitting LED 6 device comprises one or more light-emitting LED elements 8 including first and second spaced-apart electrodes 12, 16 with one or more light-emitting layers 14 formed there-between, wherein at least one of the electrodes is a transparent electrode. A first transparent encapsulating layer 30 has a first optical index formed over transparent electrode 16 opposite the light-emitting layer 14, a light-scattering layer 22 formed over the first transparent encapsulating layer 30 opposite the transparent electrode 16, and a second transparent encapsulating layer 34, having a second optical index lower than the first optical index and formed over the light-scattering layer 22. The light-scattering layer 22 may comprise light-scattering particles 21. As shown in FIG. 1, the light-emitting LED element 8 emits light from the light-emitting layer 14 through the transparent electrode 16 out of the light-emitting LED device 6 to form a top-emitting structure. In such embodiments, the first and second encapsulating layers 30, 34 are at least partially transparent.

Figure 2:
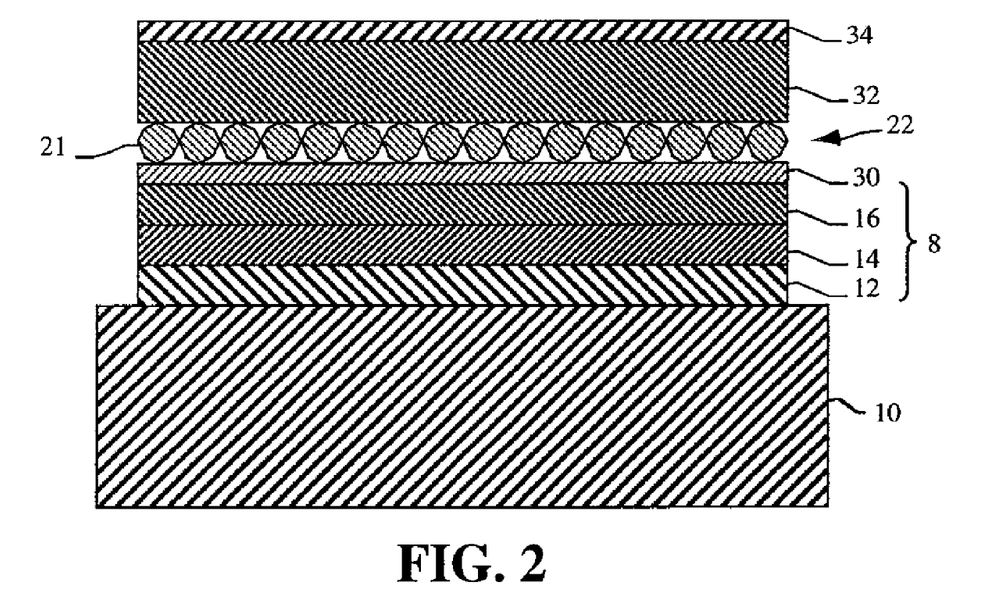
FIG. 2 is a cross section of an LED device having encapsulation layers and a light-scattering layer according to an alternative embodiment of the present invention.

Referring to FIG. 2, in a further embodiment of the present invention, the light-emitting LED 6 device further comprises an organic third transparent encapsulating layer 32 having a third optical index lower than the first optical index, and formed between the light-scattering layer 22 and the second transparent encapsulating layer 34. In this embodiment, the third optical index may be matched to the second optical index. Herein, optically matched layers are intended to substantially eliminate light reflection at the interface between the layers. For example, optical matched layers may have optical indexes that differ by 0.050 or less.

Either or both of the first and second encapsulating layers 30, 34 may be hermetic inorganic layers. For example, the first and second encapsulating layers 30, 34 may comprise inorganic metal oxides, for example, indium tin oxide, zinc oxide, aluminum oxide, aluminum zinc oxide, doped zinc oxide, silicon oxide, or silicon nitride. The first or second transparent encapsulating layer may be formed, for example, using chemical vapor deposition (CVD), atomic layer deposition (ALD), or atmospheric pressure atomic layer deposition (APALD).

The organic encapsulation layer 32 may comprise, for example, parylene. The organic encapsulation layer 32 may be deposited in a variety of ways, including chemical vapor deposition. In one embodiment, the organic encapsulation layer 32 is deposited over the scattering layer 22 in such a way that the organic materials in the organic encapsulation layer 32 do not infiltrate between light-scattering particles 21, but rather form a relatively smooth planarizing layer over the light-scattering particles 21. Applicants have formed such a planarizing, non-infiltrating layer of parylene over a scattering layer comprising titanium dioxide particles using CVD.

The first optical index of the first encapsulating layer 30 may be matched to the optical index of transparent electrode 16. Such a matching reduces reflections between the layer of transparent electrode 16 and the first encapsulation layer 30. Since such transparent electrodes commonly comprise indium tin oxide having an optical index of 1.8 or greater, in one embodiment of the present invention, the first optical index of the first encapsulating layer 30 is 1.8 or greater. Similarly, common organic materials useful for the organic third transparent encapsulating layer 32 have an optical index less than 1.8, for example, parylene at 1.65. To enhance the scattering of emitted light by the scattering layer 22, in another embodiment of the present invention, scattering particles 21 of the scattering layer 22 may have an optical index equal to or greater than the first optical index. Although FIGS. 1 and 2, illustrate a scattering layer 22 having light-scattering particles 21, the light-scattering layer 22 may comprise a high-index matrix, including low-optical-index particles or voids (not shown). Moreover, to reduce the possibility that light emitted by the light-emitting layer 14 is trapped by high-index layers in the LED element 8, the first optical index may be greater than or equal to the optical index of the one or more light-emitting layers 14. Useful materials for the first transparent encapsulating layer 30 include zinc oxide, which may be deposited in an inorganic hermetic layer using ALD processes and having an optical index of 1.85-1.95. Useful materials for the second transparent encapsulating layer 34 include aluminum oxide, which may be deposited in an inorganic hermetic layer using ALD processes and having an optical index of 1.60-1.75. Useful materials for the organic third transparent encapsulating layer 32 include parylene, which may be deposited in an organic layer using CVD processes and having an optical index of 1.60-1.75. Applicants have demonstrated the formation of such layers in the structures of the present invention and have measured the refractive indices as noted above.

The light-emitting layers 14 may comprise organic materials, for example, those found in the OLED art, or inorganic materials, for example, phosphorescent particles or core/shell quantum dots. Additional charge-control layers, either organic or inorganic, may be employed as LED element 8, for example electron- or hole-injecting layers and electron- or hole-transport layers.

Figure 3:
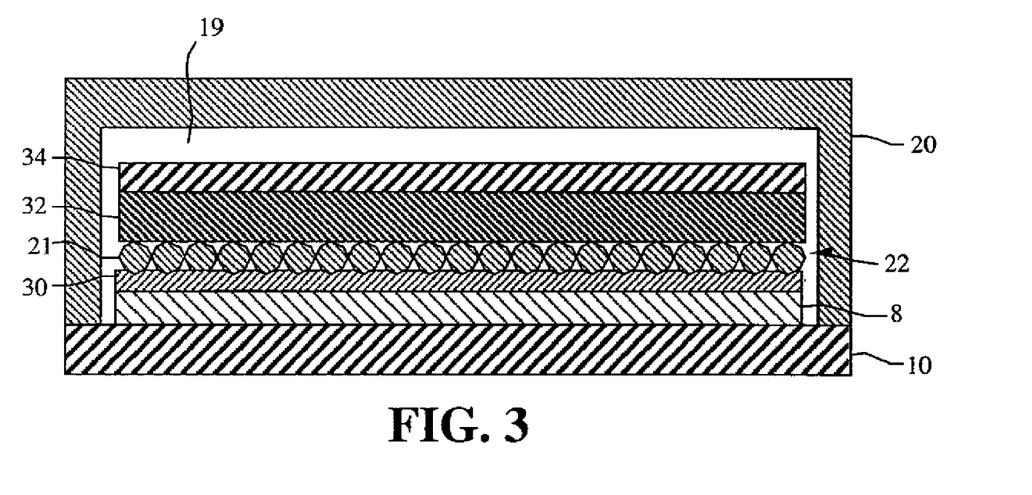
FIG. 3 is a cross section of an LED device having encapsulation layers, a light-scattering layer, and a cover according to an alternative embodiment of the present invention.

Referring to FIG. 3, the light-emitting LED device may further comprise a substrate 10 on which the LED elements 8 are formed and a cover 20 affixed to the substrate 10, forming a gap 19 between the cover 20 and the second transparent encapsulating layer 34. Such a gap 19 ensures that any light scattered out of the LED element 8 and encapsulating layers 30, 32, 34, cannot be trapped in the cover 20, since light traveling from a low-index medium (gap 19) into a high-index medium (the cover 20), cannot be trapped in the high-index medium (cover 20). The gap 19 may comprise a void (vacuum), gas (e.g. air, nitrogen, argon or other non-reactive gas) or a relatively low-index solid material, for example, a polymer. In an alternative embodiment, illustrated in FIG. 4, no separate cover 20 is provided, but a cover layer 36 may be formed comprising a curable or non-curable solid or liquid material formed over the second transparent encapsulating layer 34.

In alternative embodiments of the present invention, the first or second encapsulating layers 30, 34, may be formed of multiple layers of inorganic material, for example deposited in multiple steps of an ALD process. It is well known that the conductivity of transparent electrodes (e.g. transparent electrode 16) may be lower than desired. To enhance the distribution of current to such a transparent electrode, the first transparent encapsulating layer 30 may also be electrically conductive.

Figure 5:
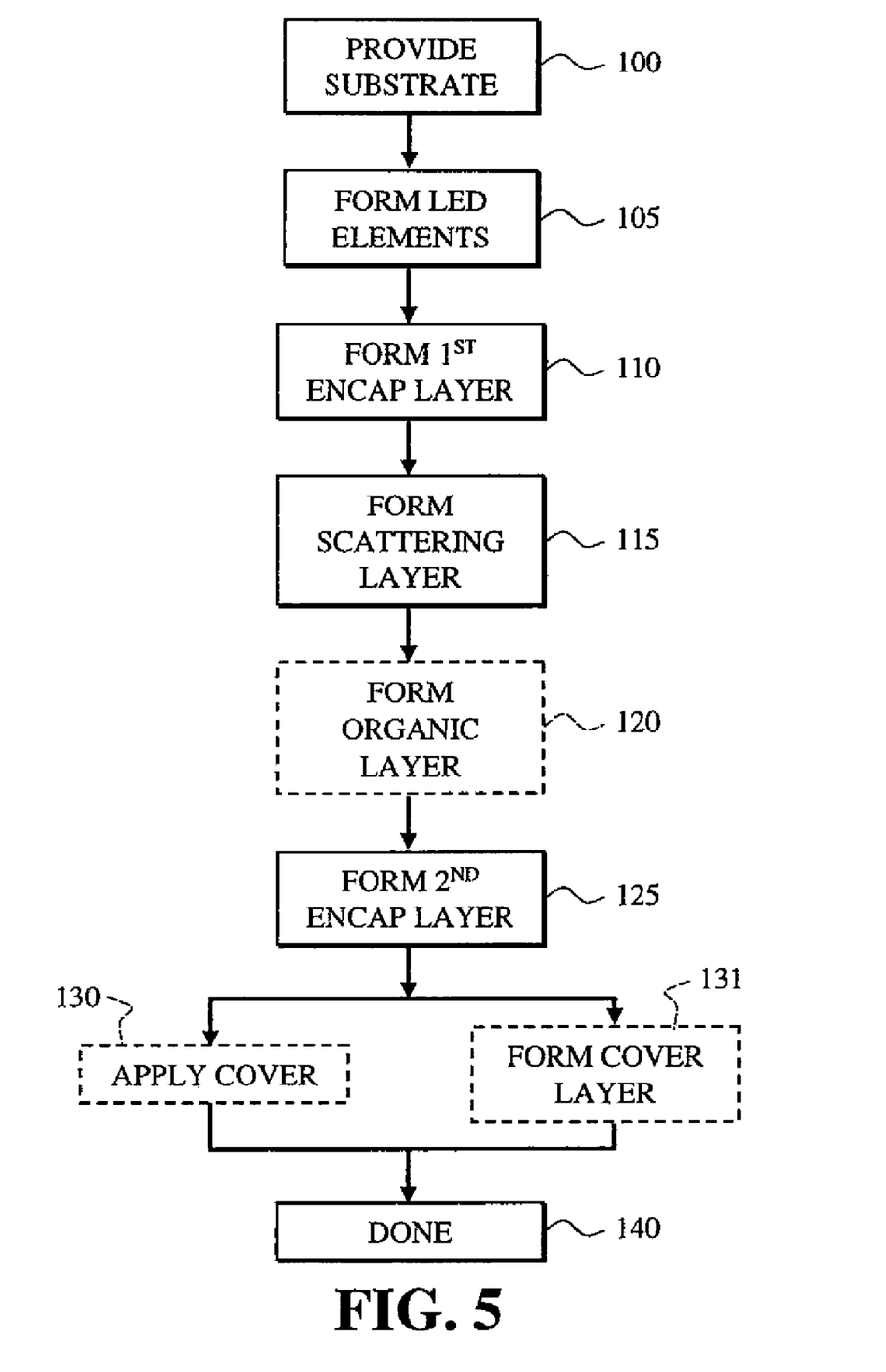
FIG. 5 is a flow diagram of a method according to an embodiment of the present invention.

A light-emitting OLED device of the present invention may be formed by employing a method comprising the steps of providing 100 a substrate, forming 105 one or more light-emitting LED elements including first and second spaced-apart electrodes with one or more light-emitting layers therebetween, wherein at least one of the electrodes is a transparent electrode over the substrate, forming 110 a first transparent encapsulating layer having a first optical index over the transparent electrode opposite the light-emitting layer, forming 115 a light-scattering layer over the first transparent encapsulating layer opposite the transparent electrode, and forming 125 a second transparent encapsulating layer having a second optical index lower than the first optical index over the light-scattering layer. A cover may be applied 130 over the substrate to protect the LED elements. Alternatively, a cover layer may be applied 131 over the substrate to protect the LED elements. After the provision of such protective covers, the construction of the light-emitting OLED device may be done 140.

In further embodiments of such a method, an organic third transparent encapsulating layer having a third optical index lower than the first optical index may be formed 120 between the light-scattering layer and the second encapsulating layer. The third optical index may be matched to the second optical index.

As is well known, LED elements 8 comprising organic materials are sensitive to environmental contamination. According to the present invention, the first and second encapsulating layers 30, 34 may provide a hermetic seal protecting the LED elements 8. The organic third transparent encapsulating layer 32 may provide further protection, but serves an additional purpose. Inorganic encapsulating layers formed over scattering layers and deposited using ALD processes are problematic in that it is difficult to completely coat scattering particles to an adequate thickness (e.g. 500 A) in a reasonable amount of time (e.g. two minutes), because of the large surface area present in the scattering layer 22 and the time required to completely suffuse the area with the precursors necessary to forming the inorganic encapsulating layer. In contrast, applicants have shown that CVD processes employing organic materials may be coated over a scattering layer 22 in a reasonable time and an inorganic encapsulating layer 34 provided over the organic third transparent encapsulating layer 32. Moreover, by leaving the inter-particle spaces in a scattering layer 22 free of solid material (organic or inorganic), the scattering layer 22 scatters light more effectively, thereby enhancing the light output efficiency of the LED elements 8.

A hermetic inorganic encapsulating layer (e.g., 30 and 34) within the context of the present invention is a layer formed of inorganic materials that provides a moisture permeation rate of less than about $10^{-4}$ gm/m²/day, more preferably about $10^{-5}$ gm/m²/day, and even more preferably about $10^{-6}$ gm/m²/day. An organic encapsulating layer within the context of the present invention is a layer formed of organic materials that provides a relatively smooth surface compared to the surface of the light-scattering layer 22. The organic encapsulating layer 32 may also provide a moisture permeation barrier and may preferably be thicker than the first and second hermetic inorganic encapsulating layers 30, 34. The organic encapsulating layer 32 may also be colored and effectively provide a color filter for filtering light emitted from the OLED elements 8. Preferably, the encapsulating layers 30, 32, 34 in combination provide a moisture permeation rate of less than about $10^{-5}$ gm/m²/day, and even more preferably provide a moisture permeation rate of less than about $10^{-6}$ gm/m²/day, to adequately protect the light-emitting layer 14.

Transparent electrodes, for example, comprising ITO, are known in the art. In a top-emitter embodiment of the present invention, electrode 16 may be transparent and electrode 12 may be reflective. Reflective electrodes, for example, comprising aluminum, silver, or magnesium or alloys thereof are also known. Light-emitting organic layers, for example, comprising OLED materials, are also known, and the formation of an OLED element comprising two electrodes 12, 16, and one-or-more light-emitting layers 14, is also known in the art.

Scattering layer 22 may comprise individual light-scattering particles 21. Such light-scattering particles 21 may be dispersed in a binder to facilitate coating and adhesion. Light-scattering particles 21 may comprise, for example, particles of titanium dioxide. Preferably, such light-scattering particles are at least 100 nm in diameter, and more preferably at least 300 nm, to optimize the scattering of visible light. The binder may be formed of, for example, a polymeric material. The scattering layer 22 may include at least one material having an optical refractive index equal to or greater than the optical index of the first hermetic inorganic encapsulation layer 30. The light-scattering layer 22 may comprise a solvent-coated layer, using spin, spray, curtain, slide, hopper, or inkjet coating.

Very thin layers of material suitable for the first hermetic inorganic encapsulating layer 30 may be formed of a variety of materials, for example, metal or silicon oxides, indium tin oxide, aluminum oxide, silicon dioxide, or nitrides such as silicon nitride deposited in thin layers. In one embodiment of the present invention, the first hermetic inorganic encapsulating layer 30 is formed adjacent to electrode 16. The second hermetic inorganic encapsulating layer 34 comprises at least one component layer formed by atomic layer deposition. For example, applicants have demonstrated an atomic layer deposition process whereby trimethylaluminum is first deposited over the transparent electrode using chemical vapor deposition followed by exposure to oxygen in the form of ozone. The aluminum and oxygen combine to form a very thin layer of $Al_2O_3$. Applicants have also demonstrated the use of ZnO and atmospheric pressure ALD processes. The process may then be repeated until a plurality of layers comprising a suitable thickness is achieved. Such a multi-layer is highly transparent and provides a thin-film encapsulating layer with very low permeation rates (for example on the order of $10^{-6}$ gm/m²/day). Subject to providing desired optical and encapsulation properties, the thin-film encapsulating layer may be less than 1 micron thick and preferably less than 400 nm and more preferably less than 100 nm. Other materials and processes may also be employed, for example as described in the "Handbook of Thin Film Process Technology" published by the Institute of Physics Publishing, 1995, edited by Glocker and Shah or as described in the "Handbook of Thin Film Materials" published by the Academic Press, Harcourt, Inc. 2002, edited by Nalwa (vol. 1, chapter 2 "Atomic Layer Deposition" by Ritala and Leskala).

Useful thin film-encapsulating layer materials which may be deposited by atomic layer deposition can include Zn, ZnSe, $ZnS_{1-x}Se_x$, ZnTe, CaS, SrS, BaS, $SrS_{1-x}Se_x$, CdS, CdTe, MnTe, HgTe, $Hg_{1-x}Cd_xTe_x$, $Cd_{1-x}Mn_xTe$, AlN, GaN, InN, $SiN_x$, $Ta_3N_5$, TiN, TiSiN, TaN, NbN, MoN, $W_2N$, $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O$, $SrTiO_3$, $BaTiO_3$, $Bi_xTi_y$, Oz, Indium Tin Oxide, Indium Oxide, $SnO_2$, NiO, $Co_3O_4$, MnOx, $LaCoO_3$, $LaNiO_3$, LaMnO3, $CaF_2$, $SrF_2$, $ZnF_2$, Si, Ge, Cu, Mo, Ta, W, $La_2S_3$, PbS, $In_2S_3$, $CuGaS_2$, and SiC (x, y, and z positive integers). In particular, ZnO or AlZnO may be employed. AlZnO may be preferred, because it may provide additional conductivity to transparent electrode 16.

The organic third transparent encapsulating layer 32 may be comprised of materials such as parylene or polymeric materials such as resins. The organic third transparent encapsulating layer 32 may be formed through CVD processes, or spin-, spray-, or inkjet-coated. Applicants have demonstrated the use of such organic materials above light-scattering layers employing, for example, techniques such as CVD or spray coating.

As taught in the prior art (FIG. 8), the inorganic layers 40, 42 in a multi-layer encapsulation coating 40 form a relatively high-index optical barrier to light emitted from the relatively low-index light-emitting organic layer 14 through total internal reflection and as described with reference to FIG. 7. According to the present invention, the use of a light-scattering layer 22 can scatter trapped light into escaping from a light-emitting organic layer 14. However, as demonstrated by applicant, locating the light-scattering layer 22 over a multi-layer encapsulation coating will not effectively extract light trapped within the OLED element (as illustrated with light-ray 3 in FIG. 7), in part because of the optical indices of the layers and in part because of their relative thickness compared to the frequencies of visible light. As also demonstrated by applicant, scattering layers 22 may be dispersed within a solvent damaging to the light-emitting organic layer 14 and may degrade the transparent electrode 16 and/or organic materials when deposited using typical deposition methods (e.g., organic or aqueous solvent coating processes) on the transparent electrode 16. Therefore, locating the light-scattering layer 22 in contact with transparent electrode 16 may damage the light-emitting organic layer 14 or transparent electrode 16. Hence, as taught in the present invention and illustrated in FIG. 1, locating the light-scattering layer 22 over the first hermetic inorganic encapsulating layer 30, but beneath an organic third transparent encapsulating layer 32 can enable the extraction of light otherwise trapped in the LED element 8 while protecting the integrity of the light-emitting organic layer 14 from both environmental contamination and the light-scattering layer 22 deposition process.

Because the transparent electrode 16 also typically has a relatively high optical index compared to the light-emitting organic layer 14, light may be trapped within the LED element 8. Hence, according to one embodiment of the present invention, the transparent electrode 16 has an optical index higher than the optical index of the light-emitting organic layer 14. The first hermetic inorganic encapsulating layer 30 may also have an optical index higher than the optical index of the light-emitting organic layer 14 and, preferably, has an optical index higher than the optical index of the transparent electrode 16. Alternatively, or in addition, the first hermetic inorganic encapsulating layer 30 may have a thickness small enough to allow evanescent light rays to pass through, for example, a thickness less than or equal to 500 nm, or preferably less than or equal to 100 nm, or more preferably less than or equal to 50 nm. Hence, the use of a relatively thinner hermetic inorganic encapsulating layer 30 with a relatively higher optical index than the optical index of the light-emitting organic layer 14 compared to a relatively thicker organic encapsulating layer with a relatively lower optical index than the optical index of the light-emitting organic layer 14 is preferred.

Referring to FIG. 3, an embodiment of the present invention may include a cover 20 (for example, comprising glass or plastic) provided over the second hermetic inorganic encapsulating layer 34 and forming a gap 19 between the cover 20 and the second hermetic inorganic encapsulating layer 34. The gap 19 may be filled with a lower-index material or a vacuum or gas so that any light that enters the gap will not be trapped by the relatively higher-optical index cover 20. The transparent low-index element 19 is preferably at least one micron thick to ensure that emitted light properly propagates through the transparent low-index element and is transmitted through the encapsulating cover 20.

Figure 4:
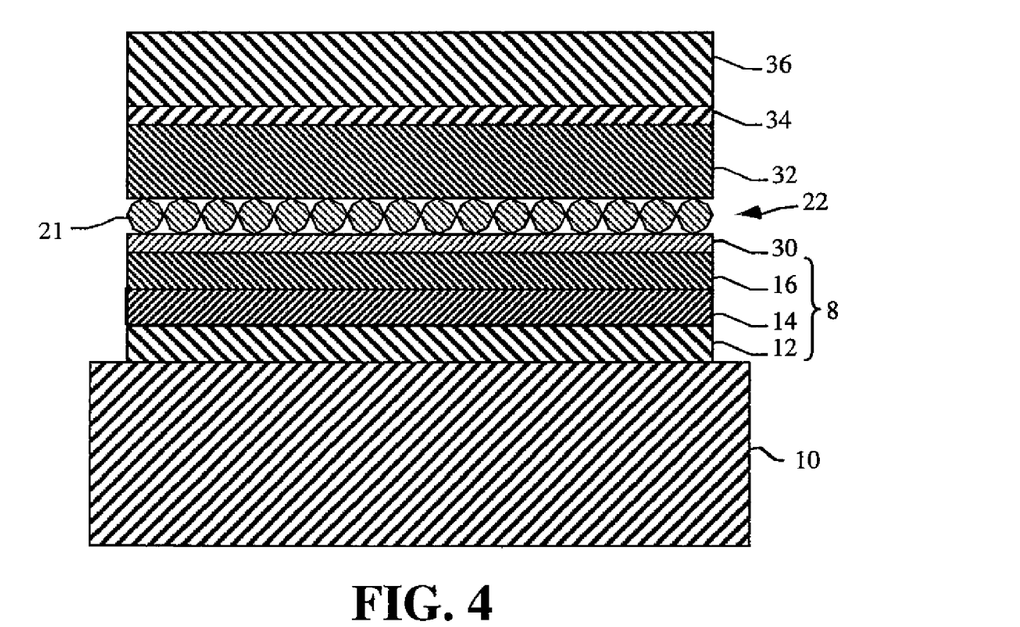
FIG. 4 is a cross section of an LED device having encapsulation layers, a light-scattering layer, and a cover layer according to an alternative embodiment of the present invention.

Alternatively, referring to FIG. 4, according to another embodiment of the present invention, a cover layer 36 comprising curable or non-curable liquid or solid materials may be formed over the second hermetic inorganic encapsulating layer 34. Preferably such a layer is relatively thin compared to the substrate 10 or cover 20, for example, less than or equal to 20 microns preferably 10 microns, so that light scattered in the cover layer will not travel far before being scattered out of the device, thereby preserving the sharpness of a device having separate light-emitting elements and employing the present invention. According to an alternative embodiment of the present invention, the second encapsulating organic layer 32 may be colored and effectively provide a color filter for filtering light emitted from the OLED elements 8. It may also be patterned. Alternatively, referring to FIG. 9, an additional color filter layer 36 may be formed over the second hermetic inorganic encapsulating layer 34 to filter light emitted from the OLED elements 8. This embodiment is useful, for example, when the OLED elements 8 emit white light and a full-color display device is desired or when improved color purity is desired.

In various embodiments of the present invention, the first and/or second hermetic inorganic encapsulating layers 30, 34 are formed from zinc oxide, aluminum oxide, aluminum zinc oxide, doped zinc oxide, aluminum oxide, silicon oxide, or silicon nitride. In a further embodiment of the present invention, the first hermetic inorganic encapsulating layer 30 may be electrically conductive, for example, employing ITO or AlZnO. The first and/or second hermetic inorganic encapsulating layers 30, 34 may be deposited by ALD processes. The organic third transparent encapsulating layer 32 may comprise polymers, resins, and may comprise parylene.

To enhance the ability of the organic third transparent encapsulating layer 32 to trap and fix particles in place, the organic encapsulating layer 32 may have a thickness of greater than 250 nm or a thickness of greater than 500 nm or a thickness of greater than 1 micron.

Figure 6A:
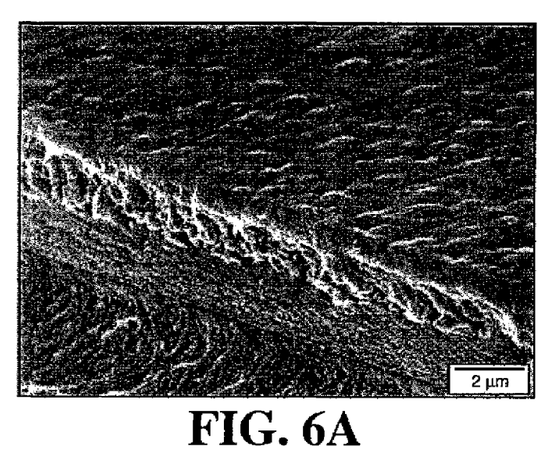
FIGS. 6A, 6B, and 6C are microscopic images of an organic encapsulation layer formed over a light-scattering layer.
Figure 6B:
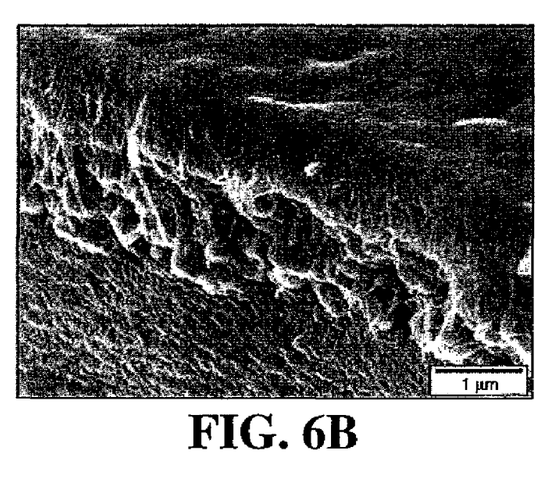
Figure 6C:
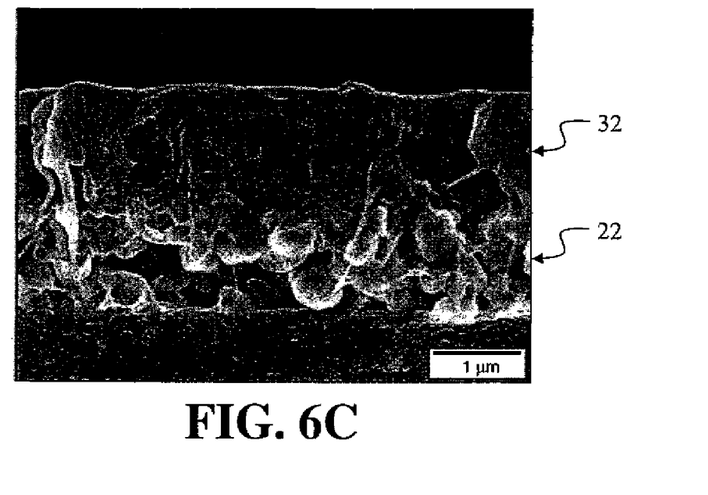

Applicants have constructed suitable encapsulation layers as taught in the present invention. Referring to FIGS. 6A, 6B, and 6C, an SEM (scanning electron microscope) image of an organic layer formed over a scattering layer is shown. As can be clearly seen from the cross-section of FIG. 6C, the organic third transparent encapsulating layer 32 materials have not penetrated the scattering layer 22, thereby maintaining the light-extraction efficiency of the light-scattering layer 22. Moreover, as shown in the top view of FIG. 6A, the organic encapsulation layer 32 forms a relatively smooth surface that can be readily employed for forming a second hermetic inorganic encapsulation layer 34 at a useful rate as taught in the present invention.

Referring to FIGS. 1-3, the present invention may operate as follows. Upon the application of a voltage across the electrodes 12 and 16, light is emitted by the organic layer(s) 14 through which current passes. This light is emitted in all directions. Light that would have been trapped in the layer(s) 14, transparent electrode 16, and first hermetic inorganic encapsulating layer 30 is scattered by scattering layer 22. The first hermetic inorganic encapsulating layer 30 preferably has an optical index higher than that of the light-emitting layer 14 and/or is sufficiently thin so that light enters the first hermetic inorganic encapsulating layer 30 and is not trapped solely in the transparent electrode 16 and light-emitting layer 14. If a thicker layer is employed, some light may be trapped within the layer(s) 14 and transparent electrode 16, depending on the relative optical indices of the materials in the respective layers relative to the first hermetic inorganic encapsulating layer 30. Scattered light may then be emitted into the organic third transparent encapsulating layer 32 and second hermetic inorganic encapsulating layer 34 at such an angle that it escapes into the low-index gap 19. Once in the low-index gap 19, the light may pass into the cover 20, but cannot be trapped there, since the cover 20 has an optical index higher than that of the low-index gap 19. Light emitted into the encapsulating layers 32, 34, at a higher angle and that does not pass into the low-index gap 19, will be reflected from the interface between the second hermetic inorganic encapsulating layer 34 and the low-index gap 19 and be redirected again by the scattering layer 22. Scattered light that is directed toward the reflective electrode 12 will be reflected from the electrode and redirected again by the scattering layer 22. In this fashion, light will either be emitted from the LED device 6 or redirected repeatedly by the scattering layer 22 until the light is emitted from the OLED device 6. It is preferred that the various layers, light-emitting layer 14, transparent electrode 16, scattering layer 22, first hermetic inorganic encapsulating layer 30, organic encapsulating layer 32, and second hermetic encapsulating layer 34 be as transparent as possible and the reflective electrode 12 be as reflective as possible to minimize the absorption of light within the OLED device.

In preferred embodiments, the cover 20 and substrate 10 may comprise glass or plastic with typical refractive indices between 1.4 and 1.6. The transparent low-index element 19 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrodes are preferably made of metal (for example aluminum, silver, or magnesium) or metal alloys. Transparent electrodes are preferably made of transparent conductive materials, for example, indium tin oxide (ITO) or other metal oxides. The light-emitting layers 14 may comprise organic materials known in the art, for example, hole-injection, hole-transport, light-emitting, electron-injection, and/or electron-transport layers. Such organic material layers are well known in the OLED art. The organic material layers typically have a refractive index between 1.6 and 1.9, while indium tin oxide has a refractive index of approximately 1.8-2.1. Hence, the various layers in the OLED element 8 have a refractive index range of 1.6 to 2.1. Of course, the refractive indices of various materials may be dependent on the wavelength of light passing through them, so the refractive index values cited here for these materials are only approximate. In any case, the transparent low-index gap 19 preferably has a refractive index at least 0.1 lower than that of each of the first refractive index range and the second refractive index at the desired wavelength for the OLED emitter. Alternatively, inorganic materials, for example, core/shell quantum dots in a semiconductor layer and forming a polycrystalline structure may be employed.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering particles 21 with a higher refractive index. Alternatively, the matrix may have a higher refractive index and the scattering particles 21 may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the index of refraction of the light-emitting layer 14. This is to insure that all of the light trapped in the light-emitting layers 14 and transparent electrode 16 can experience the direction altering effects of scattering layer 22. If scattering layer 22 has a thickness less than one-tenth part of the wavelength of the emitted light, then the materials in the scattering layer need not have such a preference for their refractive indices.

The scattering layer 22 can employ a variety of materials. For example, randomly located particles of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

Materials of the light scattering layer 22 can include organic materials (for example, polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide. The scattering layer 22 may be colored to filter the emitted light.

Conventional lithographic means can be used to create the scattering layer using 22, for example, photo-resist, mask exposures, and etching as known in the art. Alternatively, the scattering layer may be sputtered or a coating may be employed in which a liquid, for example, polymer having a dispersion of titanium dioxide, may form a scattering layer 22.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the cover 20.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. In addition to employing encapsulation layers as described herein, cover 20 may be an encapsulating edge sealed cover as is known in the art. Methods for edged encapsulation and desiccation include, but are not limited to, e.g., those described in U.S. Pat. No. 6,226,890 issued May 8, 2001 to Boroson et al.

LED devices employing this invention can also employ various well-known optical effects in order to enhance their properties, if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix LED devices. It may also be employed in display devices or in area illumination devices. In a preferred embodiment, the present invention is employed in a flat-panel LED device composed of small molecule or polymeric OLEDs or inorganic materials as disclosed in, but not limited to U.S. Pat. No. 4,769,292, issued Sep. 6, 1988 to Tang et al., and U.S. Pat. No. 5,061,569, issued Oct. 29, 1991 to VanSlyke et al., and as described in co-pending, commonly assigned U.S. Ser. No. 11/226,622 by Kahen, which is hereby incorporated by reference in its entirety, additional conducting particles may be provided with the quantum dots in a layer to enhance the conductivity of the light-emitting layer. Many combinations and variations of light-emitting materials can be used to fabricate such a device, including both active- and passive-matrix LED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4 light rays
8 OLED element
10 substrate
12 reflective electrode
14 light-emitting organic layer(s)
16 transparent electrode
19 gap
20 cover
21 scattering particles
22 scattering layer
30 first hermetic inorganic encapsulating layer
32 organic third transparent encapsulating layer
34 second hermetic inorganic encapsulating layer
36 cover layer
40 encapsulating layer
42 encapsulating layer
100 provide substrate operation
105 form LED elements operation
110 form first encapsulation layer operation
115 form scattering layer operation
120 form organic layer operation
125 form second encapsulation layer operation
130 apply cover operation
131 form cover layer operation
140 operation finished

The invention claimed is:

1. A light-emitting LED device, comprising:
one or more light-emitting LED elements including first and second spaced-apart electrodes with one or more light-emitting layers formed there-between, wherein at least one of the electrodes is a transparent electrode;
a first transparent encapsulating barrier layer having a first optical index formed over the transparent electrode opposite the light-emitting layer;
a light-scattering layer formed over the first transparent encapsulating barrier layer opposite the transparent electrode;
a second transparent encapsulating barrier layer, having a second optical index lower than the first optical index, formed over the light-scattering layer opposite the first transparent encapsulating barrier layer; and
an organic third transparent encapsulating layer having a third optical index lower than the first optical index formed between the light-scattering layer and the second transparent encapsulating barrier layer.

2. The light-emitting LED device of claim 1, wherein the third optical index is matched to the second optical index.

3. The light-emitting LED device of claim 1, wherein the organic third transparent encapsulating layer comprises parylene.

4. The light-emitting LED device of claim 1, wherein the organic third transparent encapsulating layer is deposited using chemical vapor deposition.

* * * * *